United States Patent
Lee et al.

(10) Patent No.: US 10,319,263 B2
(45) Date of Patent: Jun. 11, 2019

(54) FLEXIBLE DISPLAY

(71) Applicant: Samsung Display Co., Ltd., Yongin, Gyeonggi-do (KR)

(72) Inventors: Jung Hun Lee, Hwaseong-si (KR); Sang Jo Lee, Hwaseong-si (KR); Jang Doo Lee, Suwon-si (KR); Ju Suck Lee, Seoul (KR); Kyung Min Choi, Seoul (KR); Won Suk Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 482 days.

(21) Appl. No.: 14/675,188

(22) Filed: Mar. 31, 2015

(65) Prior Publication Data

US 2016/0161983 A1    Jun. 9, 2016

(30) Foreign Application Priority Data

Dec. 4, 2014    (KR) .................. 10-2014-0172851

(51) Int. Cl.
| | |
|---|---|
| *G06F 1/16* | (2006.01) |
| *G09F 9/30* | (2006.01) |
| *H01L 27/32* | (2006.01) |
| *H01L 51/00* | (2006.01) |

(52) U.S. Cl.
CPC ............ *G09F 9/301* (2013.01); *G06F 1/1652* (2013.01); *H01L 27/32* (2013.01); *H01L 51/0097* (2013.01); *H01L 2251/5338* (2013.01)

(58) Field of Classification Search
CPC ...................................................... G06F 1/1652
See application file for complete search history.

(56) References Cited

U.S. PATENT DOCUMENTS

| | | | |
|---|---|---|---|
| 6,301,754 B1 * | 10/2001 | Grunberger | A41F 1/002 24/303 |
| 8,001,711 B2 | 8/2011 | LaFarre et al. | |
| 8,516,728 B2 | 8/2013 | Jung | |
| 8,654,519 B2 | 2/2014 | Visser et al. | |
| 2001/0008582 A1 * | 7/2001 | Sato | G02F 1/133348 396/429 |
| 2006/0007368 A1 | 1/2006 | Slikkerveer et al. | |

(Continued)

FOREIGN PATENT DOCUMENTS

| | | |
|---|---|---|
| JP | 3816457 B2 | 6/2006 |
| KR | 10-2010-0017284 A | 2/2010 |

(Continued)

*Primary Examiner* — Matthew Yeung
(74) *Attorney, Agent, or Firm* — Lewis Roca Rothgerber Christie LLP

(57) ABSTRACT

A flexible display is disclosed. In one aspect, the flexible display a flexible display panel includes a display area and a peripheral area located on opposing sides of the display area and a first fixing part located over an upper surface of the peripheral area of the flexible display panel. The first fixing part is configured to have a first restoring force that presses on the upper surface of the flexible display panel. The flexible display also includes a second fixing part located below a lower surface of the peripheral area of the flexible display panel. The second fixing part is configured to have a second restoring force that presses on the lower surface of the flexible display panel.

20 Claims, 15 Drawing Sheets

(56) References Cited

U.S. PATENT DOCUMENTS

| | | | | |
|---|---|---|---|---|
| 2006/0192726 A1* | 8/2006 | Huitema | ............... | G06F 1/1601 345/1.1 |
| 2006/0267776 A1* | 11/2006 | Taki | ...................... | B31D 1/021 340/572.8 |
| 2011/0043976 A1* | 2/2011 | Visser | ...................... | G09F 9/00 361/679.01 |
| 2012/0204453 A1* | 8/2012 | Jung | ...................... | G09F 9/301 40/517 |
| 2014/0295150 A1* | 10/2014 | Bower | ...................... | C09J 7/02 428/201 |

FOREIGN PATENT DOCUMENTS

| | | |
|---|---|---|
| KR | 10-2012-0093665 A | 8/2012 |
| TW | I441115 B | 11/2009 |
| TW | 201234327 A1 | 8/2012 |

\* cited by examiner

FLEXIBLE DISPLAY

INCORPORATION BY REFERENCE TO ANY PRIORITY APPLICATIONS

This application claims priority from Korean Patent Application No. 10-2014-0172851 filed on Dec. 4, 2014 in the Korean Intellectual Property Office, the disclosure of which is incorporated herein by reference in its entirety.

BACKGROUND

Field

The described technology generally relates to a flexible display.

Description of the Related Technology

Display devices can display images. Recently, flexible displays have been drawing attention.

Flexible displays include a flexible display panel which displays images. Flexible displays which include a flexible display panel that can be rolled or folded are currently undergoing research and development.

SUMMARY OF CERTAIN INVENTIVE ASPECTS

One inventive aspect is a flexible display having a flexible display panel that can be easily rolled and unrolled.

However, aspects of the described technology are not restricted to those set forth herein. The above and other aspects will become more apparent to one of ordinary skill in the art to which the described technology pertains by referencing the detailed description given below.

Another aspect is a flexible display including: a flexible display panel which comprises a display area and a peripheral area located on both sides of the display area; a first fixing part which is located on an upper surface of the peripheral area of the flexible display panel and has a first restoring force that presses the upper surface of the flexible display panel; and a second fixing part which is located on a lower surface of the peripheral area of the flexible display panel and has a second restoring force that presses the lower surface of the flexible display panel.

Another aspect is a flexible display including: a flexible display panel which comprises a display area and a peripheral area located on both sides of the display area; a first roll which can wind the flexible display panel therearound; a first fixing part which is located on the peripheral area of the flexible display panel; and a second fixing part which is located under the peripheral area of the flexible display panel, wherein an attractive force acts between the first fixing part and the second fixing part.

Another aspect is a flexible display comprising a flexible display panel including a display area and a peripheral area located on opposing sides of the display area; a first fixing part located over an upper surface of the peripheral area of the flexible display panel, wherein the first fixing part is configured to have a first restoring force that presses on the upper surface of the flexible display panel; and a second fixing part located below a lower surface of the peripheral area of the flexible display panel, wherein the second fixing part is configured to have a second restoring force that presses on the lower surface of the flexible display panel.

In exemplary embodiments, the flexible display further comprises a first roll configured to wind the flexible display panel therearound; a second roll configured to wind the first fixing part therearound; and a third roll configured to wind the second fixing part therearound, wherein the second roll and the third roll are configured to rotate in opposite directions. The first and second fixing parts can be formed of a ductile material. At least one of the first and second fixing parts can comprise a magnet. The flexible display panel can further include a plurality of holes formed in the peripheral area, one of the first and second fixing parts can further comprise a plurality of protrusions respectively corresponding to the holes and configured to be respectively inserted into the holes.

In exemplary embodiments, the holes are arranged in a row in the peripheral area. The holes can be arranged at regular intervals. The first fixing part can further comprise a plurality of first protrusions respectively corresponding to the holes, wherein the second fixing part further comprises a plurality of second protrusions respectively corresponding to the holes, and wherein one of the first protrusions and one of the second protrusions are configured to be inserted into each of the holes. The flexible display can further comprise a handle connected to an end of the flexible display panel, an end of the first fixing part, and an end of the second fixing part.

Another aspect is a flexible display panel including a display area and a peripheral area located on opposing sides of the display area; a first roll configured to wind the flexible display panel therearound; a first fixing part located over the peripheral area of the flexible display panel; and a second fixing part located under the peripheral area of the flexible display panel, wherein the first and second fixing parts are configured to have an attractive force therebetween.

In exemplary embodiments, one of the first and second fixing parts comprises a magnet and the other of the first and second fixing parts comprises a magnetic material configured to be magnetized by the magnet. Each of the first and second fixing parts can comprise a magnet and a side of the first fixing part facing the peripheral area and a side of the second fixing part facing the peripheral area can have opposite polarities. The first fixing part can be configured to have a first restoring force which presses on an upper surface of the flexible display panel and the second fixing part can be configured to have a second restoring force which presses on a lower surface of the flexible display panel.

In exemplary embodiments, the flexible display further comprises a second roll configured to wind the first fixing part therearound; and a third roll configured to wind the second fixing part therearound, wherein the second roll and the third roll are configured to rotate in opposite directions. The first and second fixing parts can be formed of a ductile material. The flexible display panel can further include a plurality of holes formed in the peripheral area and one of the first and second fixing parts can further comprise a plurality of protrusions respectively corresponding to the holes and configured to be respectively inserted into the holes.

In exemplary embodiments, the holes are arranged in a row in the peripheral area. The holes can be arranged at regular intervals. The first fixing part can further comprise a plurality of first protrusions respectively corresponding to the holes, wherein the second fixing part further comprises a plurality of second protrusions respectively corresponding to the holes, and wherein one of the first protrusions and one of the second protrusions are configured to be inserted into each of the holes. The flexible display can further comprise a handle connected to an end of the flexible display panel, an end of the first fixing part, and an end of the second fixing part.

BRIEF DESCRIPTION OF THE DRAWINGS

The above and other aspects and features of the described technology will become more apparent by describing in detail exemplary embodiments thereof with reference to the attached drawings, in which.

DETAILED DESCRIPTION OF CERTAIN INVENTIVE EMBODIMENTS

Figure 1:
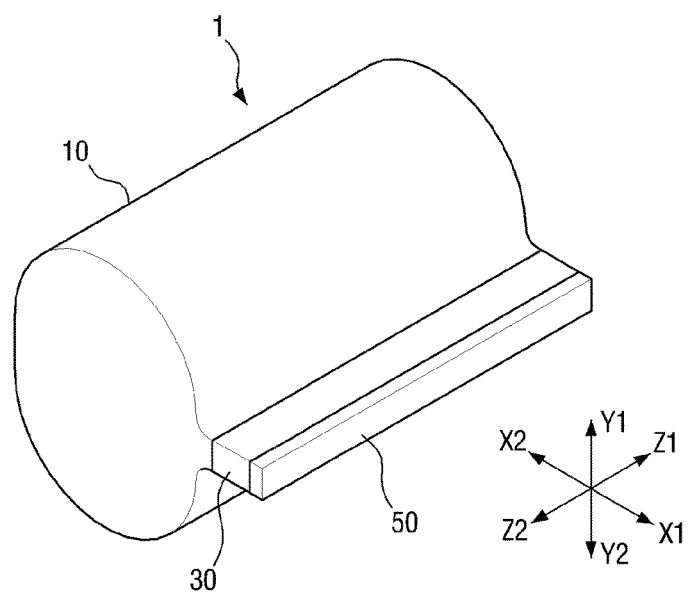
FIGS. 1 and 2 are perspective views of a flexible display according to an embodiment.

Advantages and features of the described technology and methods of accomplishing the same may be understood more readily by reference to the following detailed description and the accompanying drawings. The described technology may, however, be embodied in many different forms and should not be construed as being limited to the embodiments set forth herein. Rather, these embodiments are provided so that this disclosure will be thorough and complete and will fully convey the concept of the described technology to those skilled in the art and the invention will only be defined by the appended claims. Like reference numerals refer to like elements throughout the specification.

The terminology used herein is for the purpose of describing particular embodiments only and is not intended to be limiting of the described technology. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may also be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

For the purposes of this disclosure, "at least one of X, Y, and Z" and "at least one selected from the following: X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the described technology.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the described technology.

Unless otherwise defined, all terms (including technical and scientific terms) used herein have the same meaning as commonly understood by one of ordinary skill in the art to which the described technology belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, embodiments of the described technology will be described with reference to the attached drawings.

Figure 2:
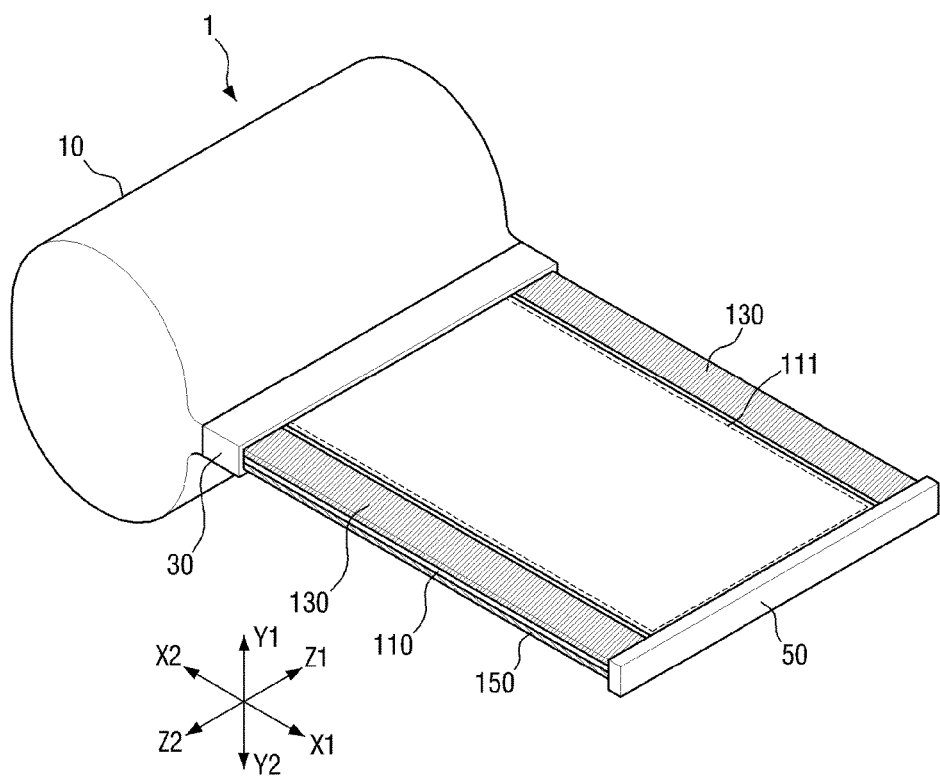
Figure 3:
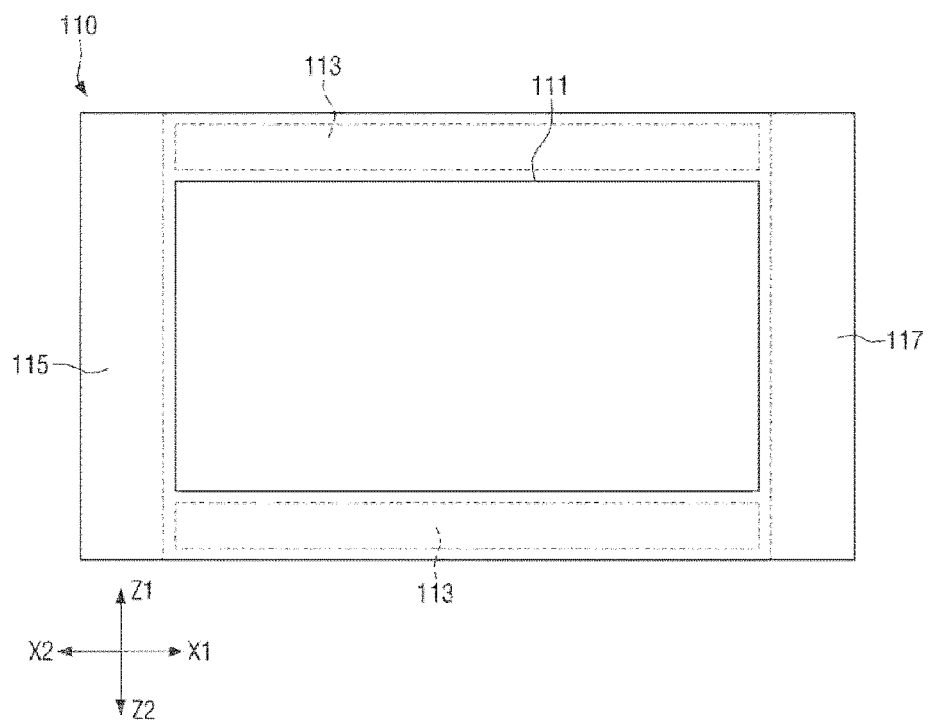
FIG. 3 is a plan view of the flexible display panel illustrated in FIG. 2.
Figure 4:
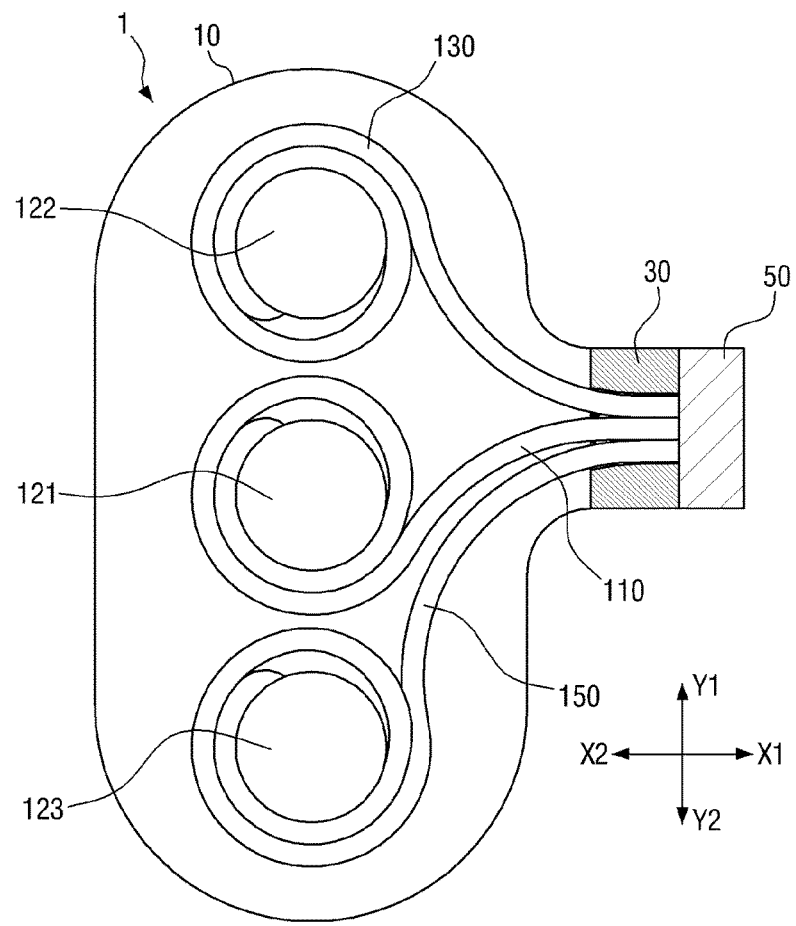
FIGS. 4 and 5 are respective internal side views of the flexible display illustrated in FIGS. 1 and 2.
Figure 5:
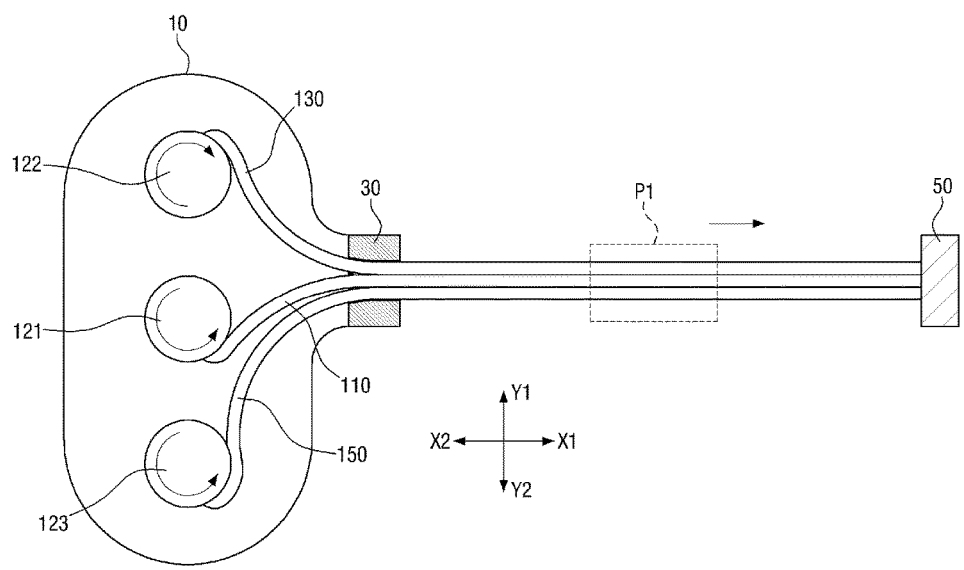
Figure 6:
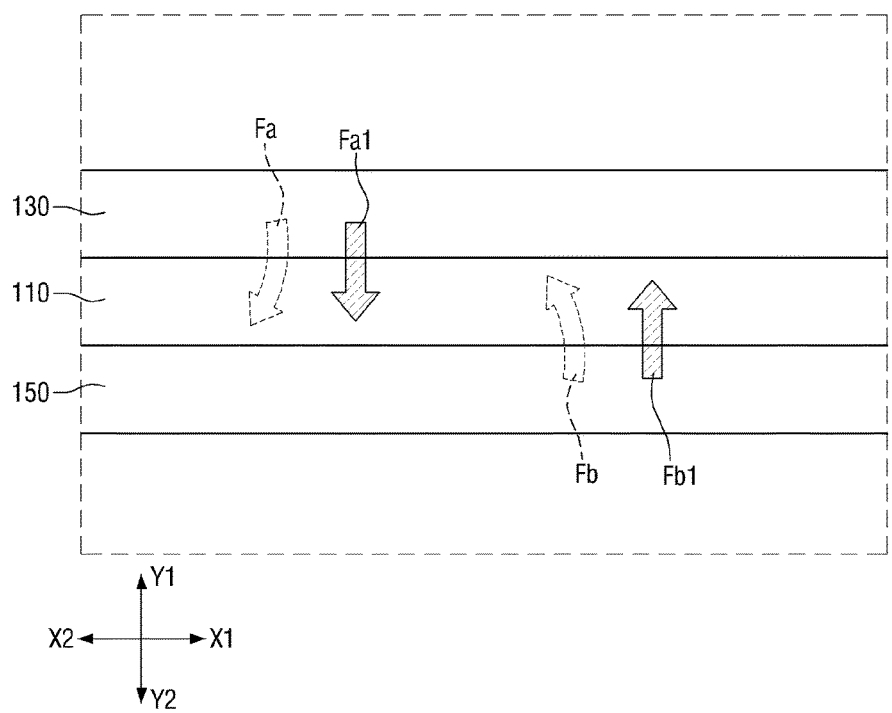
FIG. 6 is an enlarged view of a portion of the flexible display illustrated in FIG. 5.

FIGS. 1 and 2 are perspective views of a flexible display device or flexible display 1 according to an embodiment. More specifically, FIG. 1 is a perspective view of the flexible display device 1 having a flexible display panel 110 that has been rolled up. FIG. 2 is a perspective view of the flexible display device 1 where the flexible display panel 110 is unrolled. FIG. 3 is a plan view of the flexible display panel 110 illustrated in FIG. 2. FIGS. 4 and 5 are respective internal side views of the flexible display device 1 illustrated in FIGS. 1 and 2. FIG. 6 is an enlarged view of a portion of the flexible display device 1 illustrated in FIG. 5, more specifically, portion P1 of FIG. 5.

Referring to FIGS. 1 through 6, the flexible display device 1 according to the current embodiment includes the flexible display panel 110, a first fixing part 130, a second fixing part 150 and a first roll 121. The flexible display device 1 further include a housing 10, a second roll 122, a third roll 123, and a handle 50. The flexible display device 1 may further include a guide part or guide 30.

The flexible display panel 110 is flexible, enabling it to be rolled or unrolled. The flexible display panel 110 includes a display area 111 which displays images and a peripheral area 113 which is located on both sides (in Z1 and Z2 directions) of the display area 111. No images are displayed in the peripheral area 113. The flexible display panel 110 further includes a first portion 115 and a second portion 117 located at both ends (in X1 and X2 directions) of the display area 111. The first portion 115 is fixed to the first roll 121 which will be described later and the second portion 117 is fixed to the handle 50 which will be described later. The flexible display panel 110 may include flexible substrates or films which face each other with liquid crystals or organic light-emitting diodes (OLEDs) interposed therebetween, but the described technology is not limited to this structure.

The first fixing part 130 is located over the peripheral area 113 of the flexible display panel 110 and the second fixing part 150 is located under the peripheral area 113 of the flexible display panel 110. When seen in a plan view, the first fixing part 130 and the second fixing part 150 overlap the peripheral area 113, but not the display area 111.

When the flexible display panel 110 is unrolled, the first fixing part 130 and the second fixing part 150 fix the peripheral area 113 of the flexible display panel 110. Accordingly, the unrolled flexible display panel 110 can be kept flat.

The first fixing part 130 and the second fixing part 150 may be formed of a ductile material that can be rolled or unrolled. In some embodiments, the first fixing part 130 and the second fixing part 150 are formed of, but not limited to, a ductile film, plastic, rubber, etc.

An end of the first fixing part 130 is fixed to the second roll 122 which will be described later and the other end of the first fixing part 130 is fixed to the handle 50. Likewise, an end of the second fixing part 150 is fixed to the third roll 123 which will be described later and the other end of the second fixing part 150 is fixed to the handle 50.

The handle 50 is used to unroll the flexible display panel 110. The handle 50 is connected to the second portion 117 located at an end (in the X1 direction) of the flexible display panel 110. In addition, the handle 50 is connected to the other end of the first fixing part 130 and the other end of the second fixing part 150 as described above. The handle 50 supports the flexible display panel 110 such that the end (in the X1 direction) of the flexible display panel 110 can be kept flat. In addition, the handle 50 can function as a stopper that prevents the flexible display panel 110, the first fixing part 130 and the second fixing part 150 as a whole from being completely rolled into the housing 10.

The flexible display panel 110 can be wound around the first roll 121. The flexible display panel 110 can be wound around the first roll 121 in any direction. For example, when the flexible display panel 110 is not unrolled, the flexible display panel 110 can be wound around the first roll 121 in a clockwise direction as illustrated in the drawings. However, the described technology is not limited thereto, and the flexible display panel 110 can also be wound around the first roll 121 in a counterclockwise direction. In some embodiments, the first roll 121 receives rotary power from a spiral spring (hereinafter, referred to as a first spiral spring) fixed to a shaft (hereinafter, referred to as a first shaft) therein. The first spiral spring can be wound around or unwound from the first roll 121 by the rotation of the first roll 121. The first spiral spring can be unwound from the first shaft when the flexible display panel 110 is wound around the first roll 121 and can be wound around the first shaft when the flexible display panel 110 is unwound from the first roll 121. Therefore, the first spiral spring can provide a restoring force that causes the flexible display panel 110 to be wound around the first roll 121.

The first fixing part 130 can be wound around the second roll 122. In some embodiments, the second roll 122, like the first roll 121, receives rotary power from a spiral spring (hereinafter, referred to as a second spiral spring) fixed to a shaft (hereinafter, referred to as a second shaft) therein. The second spiral spring can be unwound from the second shaft when the first fixing part 130 is wound around the second roll 122 and can be wound around the second shaft when the first fixing part 130 is unwound from the second roll 122. Therefore, the second spiral spring can provide a restoring force that causes the first fixing part 130 to be wound around the second roll 122. The direction in which the first fixing part 130 is wound around the second roll 122 can be dependent on the direction in which the flexible display panel 110 is unrolled. In an example, when the flexible display panel 110 is to be unrolled in the X1 direction from the first roll 121, the first fixing part 130 can be wound around the second roll 122 in the clockwise direction before being unwound from the second roll 122. Then, when the flexible display panel 110 is unrolled in the X1 direction, the second roll 122 can rotate in the clockwise direction. Accordingly, the first fixing part 130 can be unwound from the second roll 122. In addition, when the flexible display panel 110 is moved in the X2 direction to be wound around the first roll 121, the second roll 122 can rotate in the counterclockwise direction. Accordingly, the first fixing part 130 can be wound around the second roll 122.

The second fixing part 150 can be wound around the third roll 123. In some embodiments, the third roll 123, like the first roll 121 and the second roll 122, receives rotary power from a spiral spring (hereinafter, referred to as a third spiral spring) fixed to a shaft (hereinafter, referred to as a third shaft) therein. The third spiral spring can be unwound from the third shaft when the second fixing part 150 is wound around the third roll 123 and can be wound around the third shaft when the second fixing part 150 is unwound from the third roll 123. Therefore, the third spiral spring can provide a restoring force that causes the second fixing part 150 to be wound around the third roll 123. The direction in which the second fixing part 150 is wound around the third roll 123 can be dependent on the direction in which the flexible display panel 110 is unrolled. In addition, the direction in which the second fixing part 150 is wound around the third roll 123 can be opposite to the direction in which the first fixing part 130 is wound around the second roll 122. If the flexible display panel 110 is to be unrolled in the X1 direction from the first roll 121, the second fixing part 150 can be wound around the third roll 123 in the counterclockwise direction before being unwound from the third roll 123. Then, when the flexible display panel 110 is unrolled in the X1 direction, the third roll 123 can rotate in the counterclockwise direction. Accordingly, the second fixing part 150 can be unwound from the third roll 123. In addition, when the flexible display panel 110 is moved in the X2 direction to be wound around the first roll 121, the third roll 123 can rotate in the clockwise direction. Accordingly, the second fixing part 150 can be wound around the third roll 123.

The housing 10 can cover the first roll 121, the flexible display panel 110 wound around the first roll 121, the second roll 122, the first fixing part 130 wound around the second roll 122, the third roll 123, and the second fixing part 150 wound around the third roll 123. The housing 10 can have an entrance through which the flexible display panel 110, the first fixing part 130 and the second fixing part 150 can enter or leave the housing 10. The guide part 30 is provided at the entrance of the housing 10. The guide part 30 guides the movement path of the flexible display panel 110, the first fixing part 130 and the second fixing part 150. When the flexible display panel 110 is unrolled from the housing 10, the guide part 30 guides the first fixing part 130 and the flexible display panel 110 to contact each other and guides the second fixing part 150 and the flexible display panel 110 to contact each other. In addition, when the flexible display panel 110 is rolled into the housing 10, the guide part 30 can guide the flexible display panel 110 and the first fixing part 130 to be separated from each other and guide the flexible display panel 110 and the second fixing part 130 to be separated from each other.

The exemplary operation of the flexible display device 1 will now be described.

When the flexible display panel 110 is unrolled from the first roll 121 in the X1 direction, the first fixing part 130 and the second fixing part 150 are also unrolled in the X1 direction because the flexible display panel 110, the first fixing part 130 and the second fixing part 150 are fixed to the handle 50. More specifically, when the flexible display panel 110 is unrolled in the X1 direction, the first fixing part 130 wound around the second roll 122 in the clockwise direction is unrolled in the X1 direction from the second roll 122 and placed on the peripheral area 113 of the flexible display panel 110 by the guide part 30. In addition, the second fixing part 150 wound around the third roll 123 in the counterclockwise direction is unrolled in the X1 direction from the third roll 123 and placed under the peripheral area 113 of the flexible display panel 110 by the guide part 30.

The first fixing part 130 may be formed of a ductile material. As described above, the first fixing part 130 is wound around the second roll 122 in the clockwise direction. Therefore, the first fixing part 130 unrolled in the X1 direction has a first restoring force Fa that tends to bring the first fixing part 130 back to the state where the first fixing part 130 is wound around the second roll 122. In addition, since the unrolled flexible display panel 110 is located under the first fixing part 130, the first fixing part 130 has a component Fa1 of the first restoring force Fa which presses an upper surface of the flexible display panel 110 in a downward vertical direction (or an Y2 direction). Therefore, the unrolled first fixing part 130 presses the upper surface of the flexible display panel 110 based on the first restoring force Fa.

Like the first fixing part 130, the second fixing part 150 may be formed of a ductile material. As described above, the second fixing part 150 is wound around the third roll 123 in the counterclockwise direction. Therefore, the second fixing part 150 unrolled in the X1 direction has a second restoring force Fb that tends to bring the second fixing part 150 back to the state where the second fixing part 150 is wound around the third roll 123. In addition, since the unrolled flexible display panel 110 is located on the second fixing part 150, the second fixing part 150 has a component Fb1 of the second restoring force Fb which presses a lower surface of the flexible display panel 110 in an upward vertical direction (or an Y1 direction). Therefore, the unrolled second fixing part 150 presses the lower surface of the flexible display panel 110 based on the second restoring force Fb.

An end (in the X1 direction) of the unrolled flexible display panel 110 is fixed to the handle 50. In addition, an upper surface of the peripheral area 113 of the flexible display panel 110 is pressed by the first fixing part 130, and a lower surface thereof is pressed by the second fixing part 150. Therefore, the flexible display panel 110 unrolled from the housing 10 can be spread flat. According to the current embodiment, the flexible display panel 110 can be fixed to be flat using the restoring force of the first fixing part 130 and the second fixing part 150 and the configuration of the flexible display device 1 can be simplified.

Conversely, when the flexible display panel 110 is moved in the X2 direction to be wound around the first roll 121, the first fixing part 130 can be wound around the second roll 122 more easily by the first restoring force Fa. In addition, if the second roll 122 includes the second spiral spring as described above, the first fixing part 130 can be wound around the second roll 122 more easily by the restoring force of the second spiral spring.

When the flexible display panel 110 is moved in the X2 direction to be wound around the first roll 121, the second fixing part 150 can be wound around the third roll 123 more easily by the second restoring force Fb. In addition, if the third roll 123 includes the third spiral spring as described above, the second fixing part 150 can be wound around the third roll 123 more easily by the restoring force of the third spiral spring.

Figure 7:
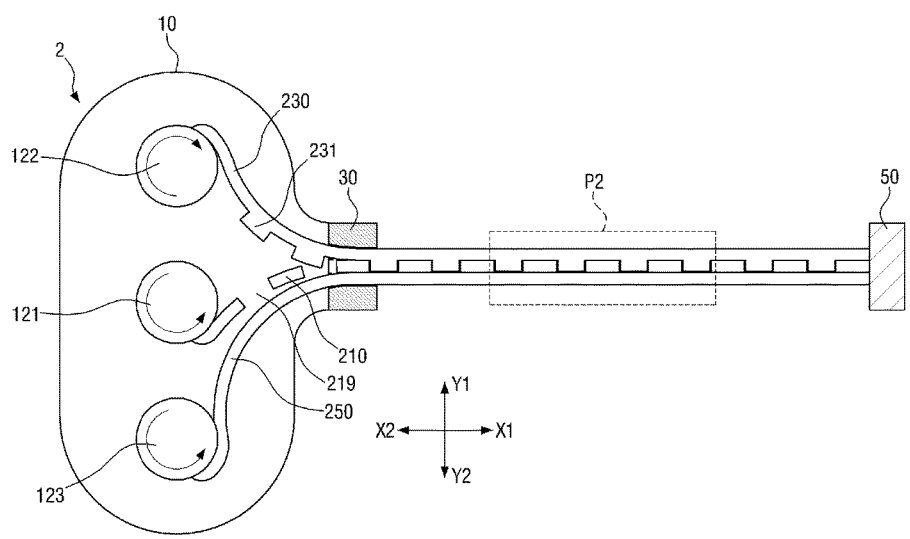
FIG. 7 is an internal side view of a flexible display according to another embodiment.
Figure 8:
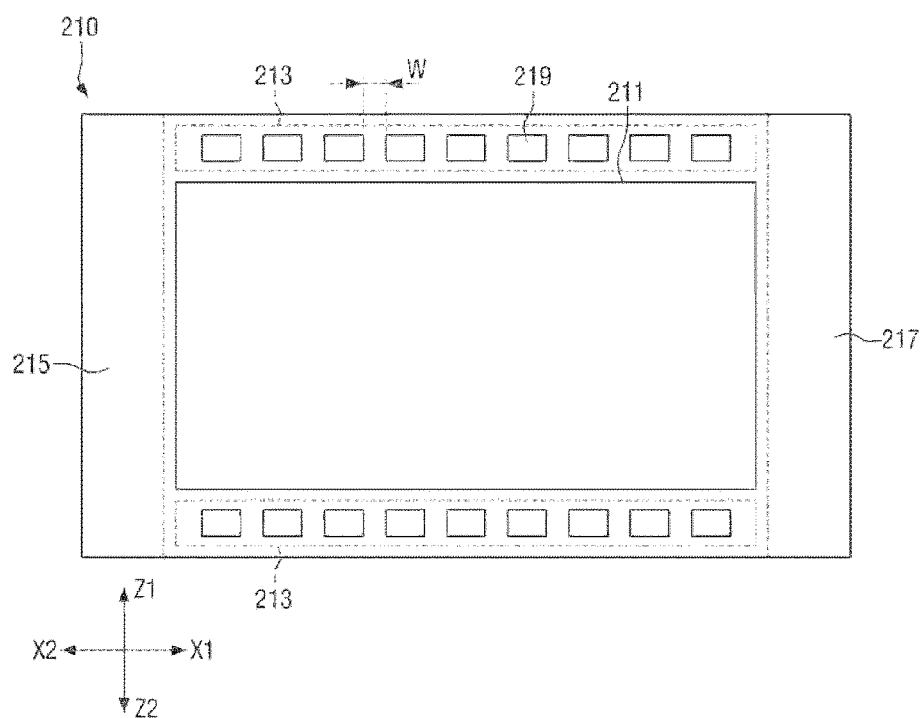
FIG. 8 is a plan view of the flexible display panel illustrated in FIG. 7.
Figure 9:
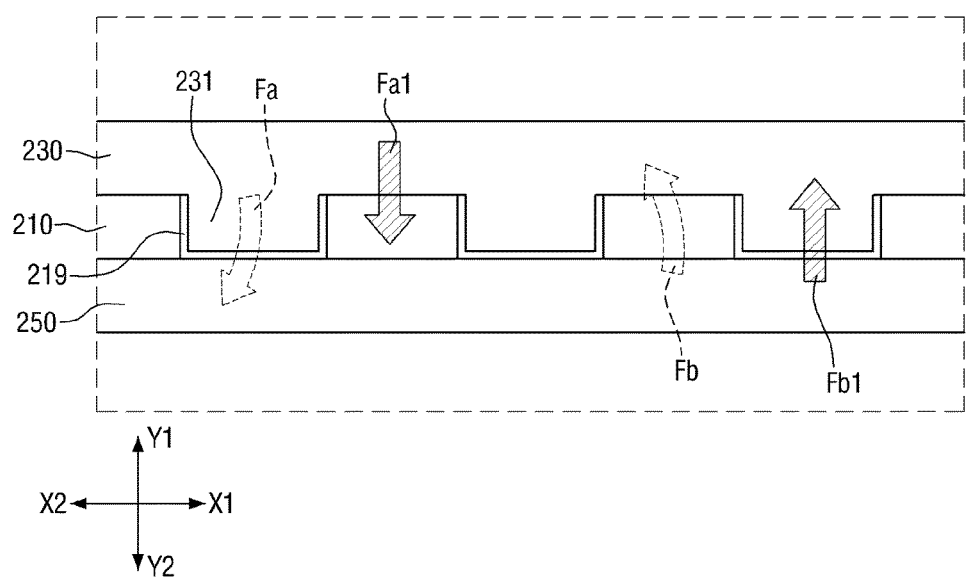
FIG. 9 is an enlarged view of a portion of the flexible display illustrated in FIG. 7.

FIG. 7 is an internal side view of a flexible display device 2 according to another embodiment. FIG. 8 is a plan view of the flexible display panel 210 illustrated in FIG. 7. FIG. 9 is an enlarged view of a portion of the flexible display device 2 illustrated in FIG. 7, more specifically, portion P2 of FIG. 7.

Referring to FIGS. 7 through 9, the flexible display device 2 according to the current embodiment includes the flexible display panel 210, a first fixing part 230, a second fixing part 250 and a first roll 121. The flexible display device 2 further include a housing 10, a second roll 122, a third roll 123, and a handle 50. The flexible display device 2 further includes a guide part 30. To avoid a redundant description, the flexible display device 2 according to the current embodiment will hereinafter be described, focusing mainly on the differences with respect to the flexible display device 1 illustrated in FIGS. 1 through 6.

The flexible display panel 210 is flexible enabling it to be rolled or unrolled. The flexible display panel 210 includes a display area 211 which displays images and a peripheral area 213 which is located on both sides (in Z1 and Z2 directions) of the display area 211. The flexible display panel 210 further includes a first portion 215 and a second portion 217 located at both ends (in X1 and X2 directions) of the display area 211. The display device 211, the first portion 215 and the second portion 217 are identical to those of FIGS. 1 through 6, and thus a description thereof is omitted.

A plurality of holes 219 are formed in the peripheral area 213 of the flexible display panel 210. In some embodiments, the holes 219 are arranged in a row in one direction (for example, an X1 or X2 direction) and at regular intervals of W. At least one of a plurality of first protrusions 231 of the first fixing part 230 which will be described later can be inserted into at least any one of the holes 219.

The first fixing part 230 is located over the peripheral area 213 of the flexible display panel 210 and the second fixing part 250 is located under the peripheral area 213 of the flexible display panel 210. When viewed from a plan view, the first fixing part 230 and the second fixing part 250 overlap the peripheral area 213, but not the display area 211.

The first fixing part 230 includes the first protrusions 231 protruding toward the flexible display panel 210. In some embodiments, the first protrusions 231 are formed at locations corresponding to the holes 219. Specifically, the first protrusions 231 are respectively formed at the locations corresponding to the holes 219. In other words, one hole 219 is located at a portion of the peripheral area 213 of the flexible display panel 210 which corresponds to one first protrusion 231, but the described technology is not limited thereto.

The second fixing part 250, the first roll 121, the second roll 122, the third roll 123, the guide part 30 and the handle 50 are identical to those of FIGS. 1 through 6, and thus a description thereof is omitted.

The exemplary operation of the flexible display device 2 will now be briefly described.

When the flexible display panel 210 is unrolled from the first roll 121 in the X1 direction, the first fixing part 230 and the second fixing part 250 are also unrolled in the X1 direction because the flexible display panel 210, the first fixing part 230 and the second fixing part 250 are fixed to the handle 50. In addition, as the flexible display panel 210 is unrolled, the first protrusions 231 are respectively inserted into the holes 219. Accordingly, the flexible display panel 210 can be fixed not only by a first restoring force Fa of the first fixing part 230 and a second restoring force Fb of the second fixing part 250 but also by the first protrusions 231 inserted into the holes 219. As a result, the flexible display panel 210 can be fixed in position more effectively.

Figure 10:
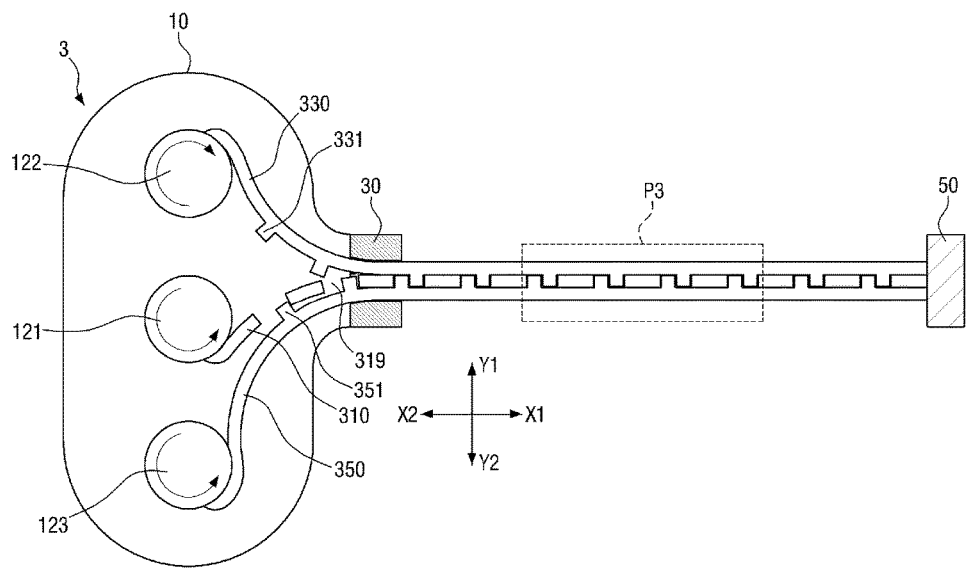
FIG. 10 is an internal side view of a flexible display according to another embodiment.
Figure 11:
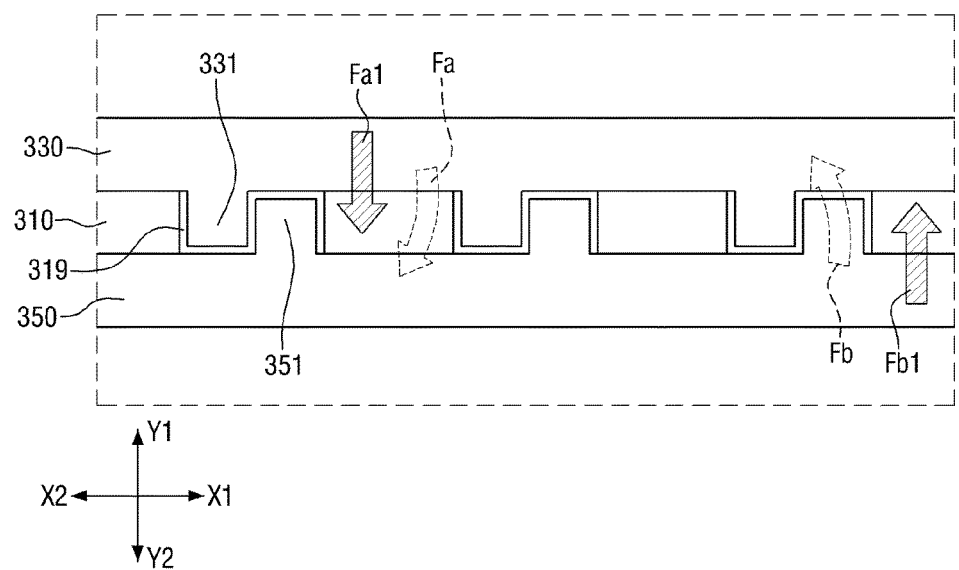
FIG. 11 is an enlarged view of a portion of the flexible display illustrated in FIG. 10.

FIG. 10 is an internal side view of a flexible display device 3 according to another embodiment. FIG. 11 is an enlarged view of a portion of the flexible display device 3 illustrated in FIG. 10, more specifically, portion P3 of FIG. 10.

Referring to FIGS. 10 and 11, the flexible display device 3 according to the current embodiment includes a flexible display panel 310, a first fixing part 330, a second fixing part 350 and a first roll 121. The flexible display device 3 further include a housing 10, a second roll 122, a third roll 123, and a handle 50. The flexible display device 3 further includes a guide part 30.

A plurality of holes 319 are formed in a peripheral area of the flexible display panel 310. A more detailed description of the holes 319 formed in the flexible display panel 310 is substantially identical to the description of the holes 219 formed in the flexible display panel 210 of FIGS. 7 through 9.

The first fixing part 330 is located over the peripheral area of the flexible display panel 310 and the second fixing part 350 is located under the peripheral area of the flexible display panel 310.

The first fixing part 330 includes a plurality of first protrusions 331 protruding toward the flexible display panel 310. In some embodiments, the first protrusions 331 are formed at locations corresponding to the holes 319. Specifically, the first protrusions 331 are respectively formed at the locations corresponding to the holes 319. In other words, one hole 319 is located at a portion of the peripheral area of the flexible display panel 310 which corresponds to one first protrusion 331, but the described technology is not limited thereto.

Like the first fixing part 330, the second fixing part 350 includes a plurality of second protrusions 351. In some embodiments, the second protrusions 351 are formed at locations corresponding to the holes 319. Specifically, the second protrusions 351 are respectively formed at the locations corresponding to the holes 319. In other words, one hole 319 are located at a portion of the peripheral area of the flexible display panel 310 which corresponds to one second protrusion 351, but the described technology is not limited thereto.

The exemplary operation of the flexible display device 3 will now briefly be described.

When the flexible display panel 310 is unrolled from the first roll 121 in an X1 direction, the first fixing part 330 and the second fixing part 350 are also unrolled in the X1 direction. In addition, as the flexible display panel 310 is unrolled, the first protrusions 331 are respectively inserted into the holes 319 and the second protrusions 351 are respectively inserted to the holes 319. In other words, one first protrusion 331 and one second protrusion 351 are inserted to one hole 319. Accordingly, the flexible display panel 310 is fixed not only by a first restoring force Fa of the first fixing part 330 and a second restoring force Fb of the second fixing part 350 but also by the first protrusions 331 and the second protrusions 351 inserted into the holes 319. As a result, the flexible display panel 310 can be fixed in position more effectively.

Figure 12:
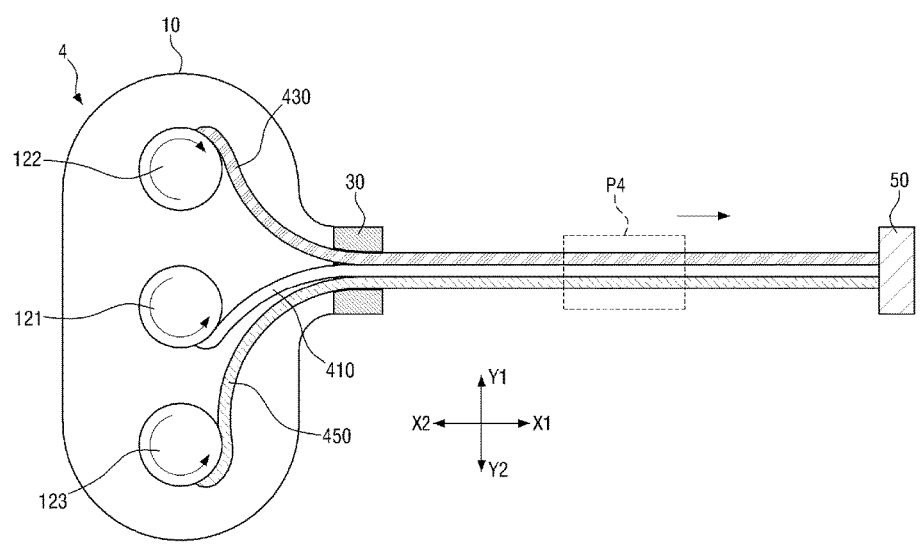
FIG. 12 is an internal side view of a flexible display according to another embodiment.
Figure 13:
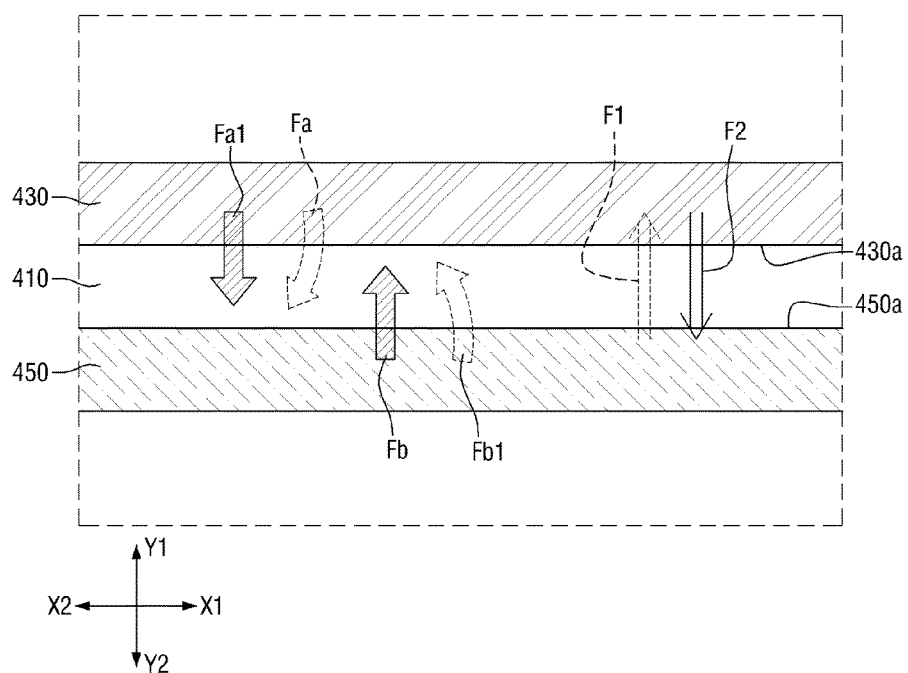
FIG. 13 is an enlarged view of a portion of the flexible display illustrated in FIG. 12.

FIG. 12 is an internal side view of a flexible display device 4 according to another embodiment. FIG. 13 is an enlarged view of a portion of the flexible display device 4 illustrated in FIG. 12, more specifically, portion P4 of FIG. 12.

Referring to FIGS. 12 and 13, the flexible display device 4 according to the current embodiment includes a flexible display panel 410, a first fixing part 430, a second fixing part 450 and a first roll 121. The flexible display device 4 further include a housing 10, a second roll 122, a third roll 123, and a handle 50. The flexible display device 4 further includes a guide part 30.

The flexible display panel 410, the housing 10, the first roll 121, the second roll 122, the third roll 123, the guide part 30 and the handle 50 are substantially identical to those of FIGS. 1 through 6, and thus a description thereof is omitted.

In the flexible display device 4 according to the current embodiment, any one of the first fixing part 430 and the second fixing part 450 includes a magnet.

In an exemplary embodiment, the first fixing part 430 includes a magnet and the second fixing part 450 include a magnetic material magnetized by the magnet, for example, a ferromagnetic material. When the flexible display panel 410 is unrolled from the first roll 121 in an X1 direction, the first fixing part 430 and the second fixing part 450 are also unrolled in the X1 direction. In addition, since the first fixing part 430 includes the magnet and the second fixing part 450 includes the magnetic material, the first fixing part 430 attracts the second fixing part 450. Accordingly, the flexible display panel 410 can be fixed flat by an attractive force F1 with which the first fixing part 430 attracts the second fixing part 450.

In another exemplary embodiment, both the first fixing part 430 and the second fixing part 450 include a magnet. When the flexible display panel 410 is unrolled from the first roll 121 in the X1 direction, the first fixing part 430 and the second fixing part 450 are also unrolled in the X1 direction. In addition, a surface 430a of the first fixing part 430 which faces the flexible display panel 410 and a surface 450a of the second fixing part 450 which faces the flexible display panel 410 have opposite polarities. Accordingly, not only the attractive force F1 with which the first fixing part 430 attracts the second fixing part 450 but also an attractive force F2 with which the second fixing part 450 attracts the first fixing part 430 act on the flexible display panel 410, thereby fixing the flexible display panel 410 flat.

In some embodiments, the first fixing part 430 has a first restoring force Fa, and the second fixing part 450 has a second restoring force Fb as illustrated in FIG. 13. In this embodiment, a component Fa1 of the first restoring force Fa which presses an upper surface of the flexible display panel 410 in a downward vertical direction (or an Y2 direction) and a component Fb1 of the second restoring force Fb which presses a lower surface of the flexible display panel 410 in an upward vertical direction (or an Y1 direction) act on the flexible display panel 410. Since the first restoring force Fa and the second restoring force Fb act on the flexible display panel 410 in addition to the attractive forces F1 and F2 between the first fixing part 430 and the second fixing part 450, the flexible display panel 410 can be fixed in position more stably.

However, the above description is merely an example, and at least any one of the first fixing part 430 and the second fixing part 450 can be formed without a restoring force.

Figure 14:
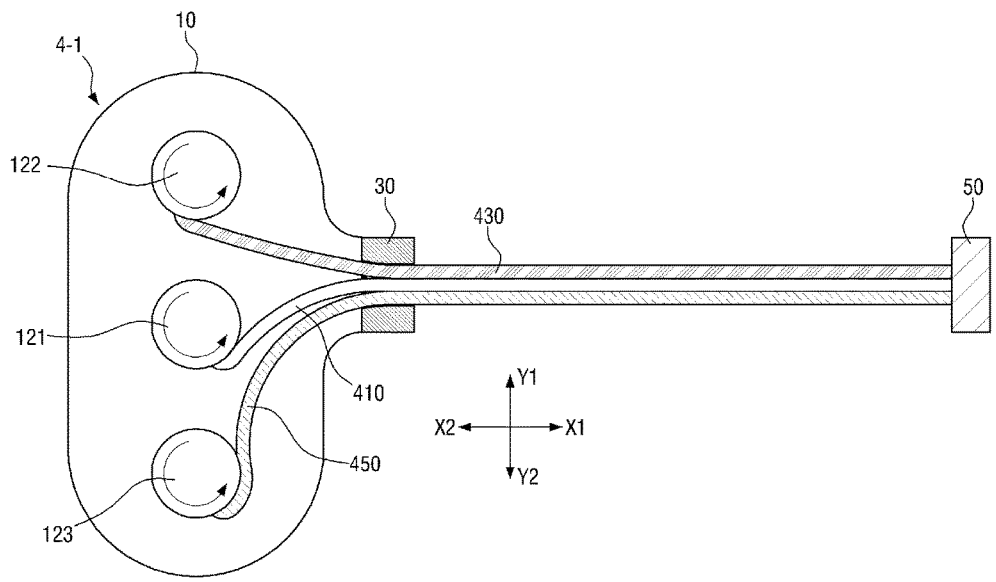
FIGS. 14 and 15 are internal side views illustrating modified embodiments of the flexible display of FIG. 12.
Figure 15:
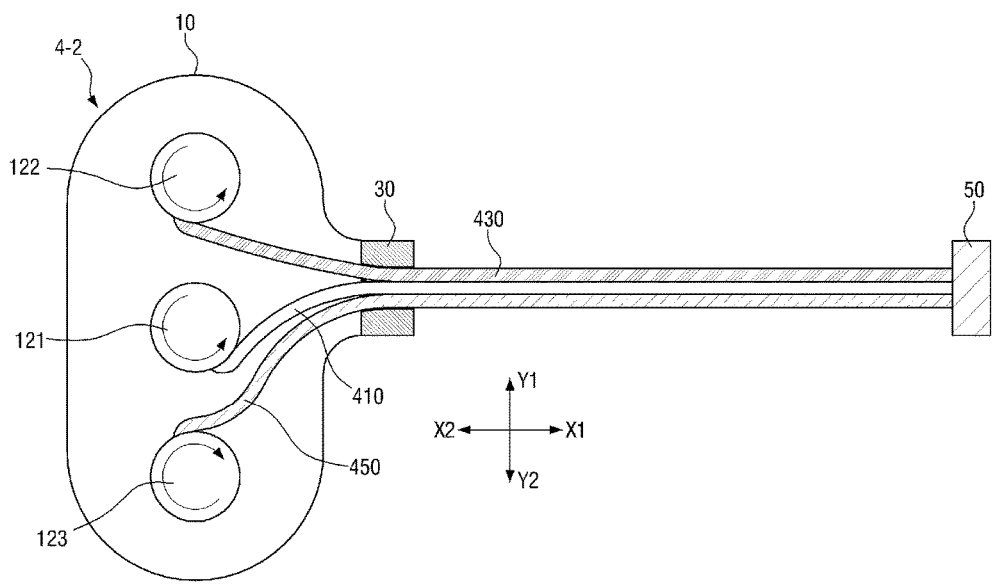

FIGS. 14 and 15 illustrate modified embodiments of the flexible display device 4 of FIG. 12.

Referring to FIGS. 12 through 14, in the flexible display device 4-1 of FIG. 14, a first fixing part 430 is wound in a different direction from a direction in which the first fixing part 430 of FIG. 12 is wound. Accordingly, the first fixing part 430 may not have a first restoring force Fa (see FIG. 13) which presses an upper surface of a flexible display panel 410 when the flexible display panel 410 is unrolled in an X1 direction.

Referring to FIGS. 12, 13 and 15, in a flexible display device 4-2 of FIG. 15, both a first fixing part 430 and a second fixing part 450 are wound in different directions from directions in which the first fixing part 430 and the second fixing part 450 of FIG. 12 are wound. Accordingly, the first fixing part 430 may not have a first restoring force Fa (see FIG. 13) which presses an upper surface of a flexible display panel 410 when the flexible display panel 410 is unrolled in an X1 direction Likewise, the second fixing part 450 may not have a second restoring force Fb (see FIG. 13) which presses a lower surface of the flexible display panel 410.

For ease of description, an embodiment where a first fixing part and a second fixing part are wound in the same directions as in FIG. 12 will hereinafter be described as an example. However, the described technology is not limited to this case, and the directions in which the first fixing part and the second fixing part are wound can be changed, for example, to the directions illustrated in FIGS. 14 and 15.

Figure 16:
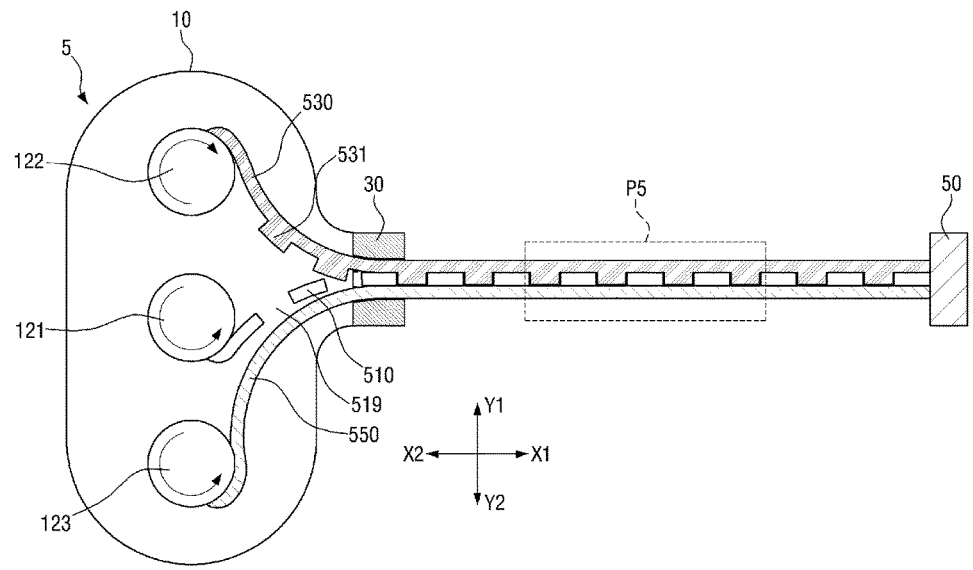
FIG. 16 is an internal side view of a flexible display according to another embodiment.
Figure 17:
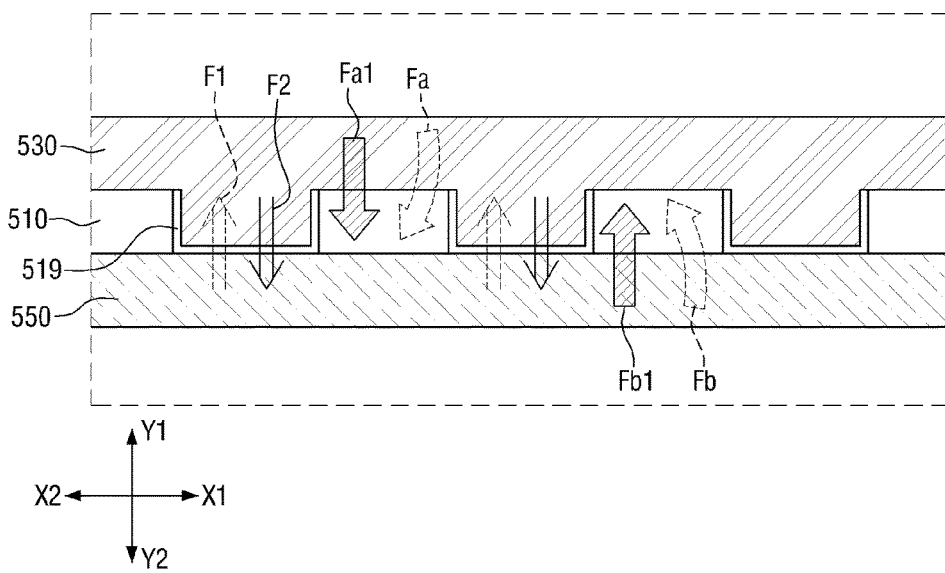
FIG. 17 is an enlarged view of a portion of the flexible display illustrated in FIG. 16.

FIG. 16 is an internal side view of a flexible display device 5 according to another embodiment. FIG. 17 is an enlarged view of a portion of the flexible display device 5 illustrated in FIG. 16, more specifically, portion P5 of FIG. 16.

Referring to FIGS. 16 and 17, the flexible display device 5 according to the current embodiment includes a flexible display panel 510, a first fixing part 530, a second fixing part 550 and a first roll 121 and further includes a housing 10, a second roll 122, a third roll 123, and a handle 50. The flexible display device 5 further includes a guide part 30.

The structure of the flexible display device 5 according to the current embodiment is substantially the same as the structure of the flexible display device 2 described above with reference to FIGS. 7 through 9. In addition, in the flexible display device 5, at least any one of the first fixing part 530 and the second fixing part 550 includes a magnet as described above with reference to FIGS. 12 and 13. That is, if the first fixing part 530 includes a magnet, the second fixing part 550 includes a magnetic material. In this embodiment, an attractive force F1 acts between the first fixing part 530 and the second fixing part 550. Alternatively, both the first fixing part 530 and the second fixing part 550 may include a magnet. In this embodiment, attractive forces F1 and F2 act between the first fixing part 530 and the second fixing part 550.

A plurality of holes 519 are formed in a peripheral area of the flexible display panel 510. The first fixing part 530 includes a plurality of first protrusions 531 at locations corresponding to the holes 519. When the flexible display panel 510 is unrolled from the first roll 121 in an X1 direction, the first protrusions 531 are respectively inserted into the holes 519. Accordingly, the flexible display panel 510 can be fixed not only by an attractive force between the first fixing part 530 and the second fixing part 550 but also by the first protrusions 531 inserted into the holes 519. As a result, the flexible display panel 510 can be fixed in position more effectively. In some embodiments, the first fixing part 530 has a first restoring force Fa, and the second fixing part 450 has a second restoring force Fb. In these embodiments, the flexible display panel 510 can be fixed more securely.

Figure 18:
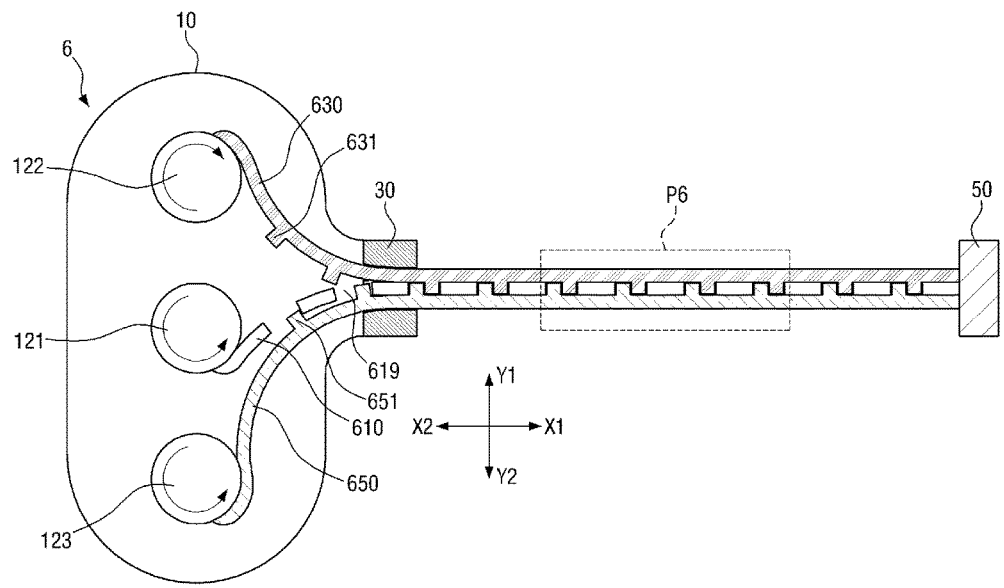
FIG. 18 is an internal side view of a flexible display according to another embodiment.
Figure 19:
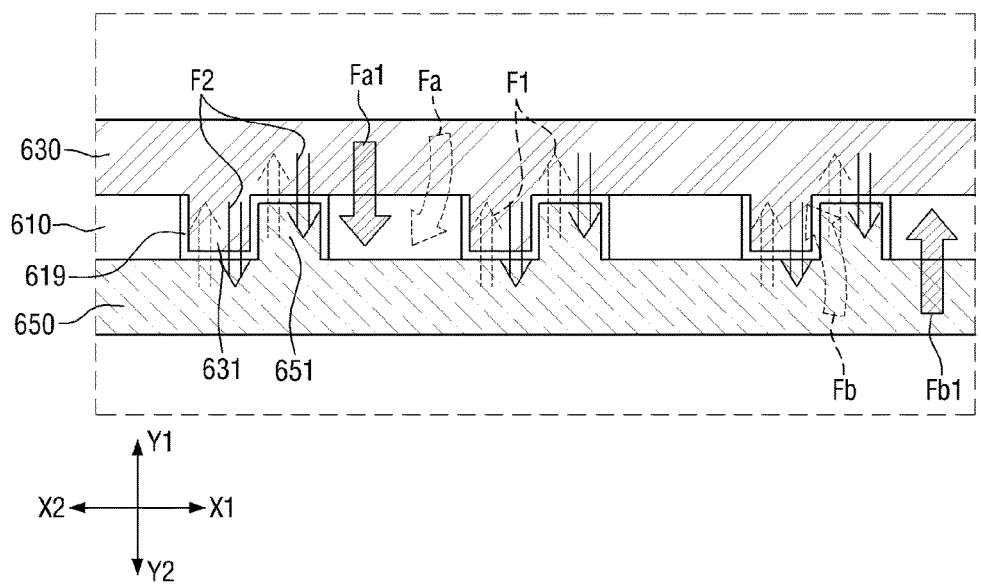
FIG. 19 is an enlarged view of a portion of the flexible display illustrated in FIG. 18.

FIG. 18 is an internal side view of a flexible display device 6 according to another embodiment. FIG. 19 is an enlarged view of a portion of the flexible display device 6 illustrated in FIG. 18, more specifically, portion P6 of FIG. 18.

Referring to FIGS. 18 and 19, the flexible display device 6 according to the current embodiment includes a flexible display panel 610, a first fixing part 630, a second fixing part 650 and a first roll 121. The flexible display device 6 further include a housing 10, a second roll 122, a third roll 123, and a handle 50. The flexible display device 6 further includes a guide part 30.

The structure of the flexible display device 6 according to the current embodiment may be substantially the same as the structure of the flexible display device 3 described above with reference to FIGS. 10 and 11. In addition, in the flexible display device 6, at least any one of the first fixing part 630 and the second fixing part 650 may include a magnet as described above with reference to FIGS. 12 and 13. That is, when the first fixing part 630 includes a magnet, the second fixing part 650 includes a magnetic material. In this embodiment, an attractive force F1 acts between the first fixing part 630 and the second fixing part 650. In other embodiments, both the first fixing part 630 and the second fixing part 650 include a magnet. In these embodiments, attractive forces F1 and F2 act between the first fixing part 630 and the second fixing part 650.

A plurality of holes 619 are formed in a peripheral area of the flexible display panel 610. The first fixing part 630 includes a plurality of first protrusions 631 at locations corresponding to the holes 619. In addition, the second fixing part 650 includes a plurality of second protrusions 651 at locations corresponding to the holes 619.

When the flexible display panel 610 is unrolled from the first roll 121 in an X1 direction, the first protrusions 631 are respectively inserted into the holes 619 and the second protrusions 651 are respectively inserted into the holes 619. In other words, one first protrusion 631 and one second protrusion 651 are inserted into one hole 619. That is, in the flexible display device 6 according to the current embodiment, the flexible display panel 610 is fixed not only by an attractive force between the first fixing part 630 and the second fixing part 650 but also by the first protrusions 631 and the second protrusions 651 inserted into the holes 619. As a result, the flexible display panel 610 can be fixed in position more effectively.

In some embodiments, the first fixing part 630 has a first restoring force Fa and the second fixing part 650 has a second restoring force Fb. In these embodiments, the flexible display panel 610 can be fixed more securely.

At least one embodiment of the described technology has at least one of the following advantages.

The described technology discloses a flexible display device in which a flexible display panel can be easily rolled and unrolled.

However, the effects of the described technology are not restricted to the one set forth herein. The above and other effects of the described technology will become more apparent to one of daily skill in the art to which the described technology pertains by referencing the claims.

While the inventive technology has been particularly shown and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A flexible display, comprising:
    a flexible display panel including a display area a peripheral area located on opposing sides of the display area;
    a first fixing part located over an upper surface of the peripheral area of the flexible display panel, wherein the first fixing part is configured to have a first restoring force pointing to a winding direction of the first fixing part and having a component that presses on the upper surface of the flexible display panel in an unrolled state; and
    a second fixing part located below a lower surface of the peripheral area of the flexible display panel, wherein the second fixing part is configured to have a second restoring force pointing to a winding direction of the second fixing part and having a component that presses on the lower surface of the flexible display panel in the unrolled state,
    wherein the peripheral area is configured to be interposed between the first and second fixing parts in the unrolled state.

2. The flexible display of claim 1, further comprising:
    a first roll configured to wind the flexible display panel therearound;
    a second roll configured to wind the first fixing part therearound; and
    a third roll configured to wind the second fixing part therearound,
    wherein the second roll and the third roll are configured to rotate in opposite directions.

3. The flexible display of claim 1, wherein the first and second fixing parts are formed of a ductile material.

4. The flexible display of claim 3, wherein at least one of the first and second fixing parts comprises a magnet.

5. The flexible display of claim 1, wherein the flexible display panel further includes a plurality of holes formed in the peripheral area, wherein one of the first and second fixing parts further comprises a plurality of protrusions respectively corresponding to the holes and configured to be respectively inserted into the holes of the flexible display panel in the unrolled state.

6. The flexible display of claim 5, wherein the holes are arranged in a row in the peripheral area.

7. The flexible display of claim 5, wherein the holes are arranged at regular intervals.

8. A flexible display, comprising:
    a flexible display panel including a display area a peripheral area located on opposing sides of the display area;
    a first fixing part located over an upper surface of the peripheral area of the flexible display panel, wherein the first fixing part is configured to have a first restoring force that presses on the upper surface of the flexible display panel in an unrolled state; and
    a second fixing part located below a lower surface of the peripheral area of the flexible display panel, wherein the second fixing part is configured to have a second restoring force that presses on the lower surface of the flexible display panel in the unrolled state,
    wherein the peripheral area is configured to be interposed between the first and second fixing parts in the unrolled state,
    wherein the flexible display panel further includes a plurality of holes formed in the peripheral area, wherein one of the first and second fixing parts further comprises a plurality of protrusions respectively corresponding to the holes and configured to be respectively inserted into the holes of the flexible display panel in the unrolled state, and
    wherein each hole of the plurality of holes comprises an opening between the upper surface of the flexible display panel and the lower surface of the flexible display panel, wherein the first fixing part further comprises a plurality of first protrusions respectively corresponding to the holes, wherein the second fixing part further comprises a plurality of second protrusions respectively corresponding to the holes, and wherein one of the first protrusions and one of the second protrusions are configured to be inserted into the opening of one of the holes.

9. The flexible display of claim 1, further comprising a handle connected to an end of the flexible display panel, an end of the first fixing part, and an end of the second fixing part.

10. A flexible display, comprising:
    a flexible display panel including a display area and a peripheral area located on opposing sides of the display area;
    a first roll configured to wind the flexible display panel therearound;

a first fixing part located over the peripheral area of the flexible display panel in an unrolled state; and a second fixing part located under the peripheral area of the flexible display panel in the unrolled state, wherein the first and second fixing parts are configured to have a magnetic attractive force therebetween, wherein the peripheral area is configured to be interposed between the first and second fixing parts in the unrolled state, and wherein at least one of the first fixing part and the second fixing part is configured to have a restoring force pointing to a winding direction of the first fixing part or the second fixing part in the unrolled state.

11. The flexible display of claim 10, wherein one of the first and second fixing parts comprises a magnet and the other of the first and second fixing parts comprises a magnetic material configured to be magnetized by the magnet.

12. The flexible display of claim 10, wherein each of the first and second fixing parts comprises a magnet and wherein a side of the first fixing part facing the peripheral area and a side of the second fixing part facing the peripheral area have opposite polarities.

13. The flexible display of claim 10, wherein the first fixing part is configured to have a first restoring force which presses on an upper surface of the flexible display in the unrolled state and wherein the second fixing part is configured to have a second restoring force which presses on a lower surface of the flexible display panel in the unrolled state.

14. The flexible display of claim 13, further comprising:
a second roll configured to wind the first fixing part therearound; and
a third roll configured to wind the second fixing part therearound,
wherein the second roll and the third roll are configured to rotate in opposite directions.

15. The flexible display of claim 13, wherein the first and second fixing parts are formed of a ductile material.

16. The flexible display of claim 10, wherein the flexible display panel further includes a plurality of holes formed in the peripheral area, and wherein one of the first and second fixing parts further comprises a plurality of protrusions respectively corresponding to the holes and configured to be respectively inserted into the holes of the flexible display panel in the unrolled state.

17. The flexible display of claim 16, wherein the holes are arranged in a row in the peripheral area.

18. The flexible display of claim 16, wherein the holes are arranged at regular intervals.

19. A flexible display, comprising:
a flexible display panel including a display area and a peripheral area located on opposing sides of the display area;
a first roll configured to wind the flexible display panel therearound;
a first fixing part located over the peripheral area of the flexible display panel in an unrolled state; and
a second fixing part located under the peripheral area of the flexible display panel in the unrolled state,
wherein the first and second fixing parts are configured to have a magnetic attractive force therebetween,
wherein the peripheral area is configured to be interposed between the first and second fixing parts in the unrolled state,
wherein the flexible display panel further includes a plurality of holes formed in the peripheral area, and wherein one of the first and second fixing parts further comprises a plurality of protrusions respectively corresponding to the holes and configured to be respectively inserted into the holes of the flexible display panel in the unrolled state, and
wherein each hole of the plurality of holes comprises an opening between an upper surface of the flexible display panel and a lower surface of the flexible display panel, wherein the first fixing part further comprises a plurality of first protrusions respectively corresponding to the holes, wherein the second fixing part further comprises a plurality of second protrusions respectively corresponding to the holes, and wherein one of the first protrusions and one of the second protrusions are configured to be inserted into the opening of one of the holes.

20. The flexible display of claim 10, further comprising a handle connected to an end of the flexible display panel, an end of the first fixing part, and an end of the second fixing part.

* * * * *